United States Patent
Yu et al.

(10) Patent No.: US 6,893,930 B1
(45) Date of Patent: May 17, 2005

(54) FABRICATION OF FIELD EFFECT TRANSISTOR WITH SHALLOW JUNCTIONS USING LOW TEMPERATURE ACTIVATION OF ANTIMONY

(75) Inventors: Bin Yu, Sunnyvale, CA (US); Haihong Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 173 days.

(21) Appl. No.: 10/161,452

(22) Filed: May 31, 2002

(51) Int. Cl.$^7$ .................................. H01L 21/336
(52) U.S. Cl. ................ 438/305; 438/308; 438/303; 438/301
(58) Field of Search ................. 438/305, 308, 438/303, 301, 231, 528, 795, 14, 197, 199, 306, 307, 486, 487, 509, 508, 530, 535, 798

(56) References Cited

U.S. PATENT DOCUMENTS

| | | | | |
|---|---|---|---|---|
| 5,973,372 A | * | 10/1999 | Omid-Zohoor et al. | 257/383 |
| 6,380,044 B1 | * | 4/2002 | Talwar et al. | 438/308 |
| 6,429,054 B1 | * | 8/2002 | Krishnan et al. | 438/149 |
| 6,465,847 B1 | * | 10/2002 | Krishnan et al. | 257/347 |
| 6,472,282 B1 | * | 10/2002 | Yu | 438/305 |

* cited by examiner

Primary Examiner—Laura Schillinger
(74) Attorney, Agent, or Firm—Monica H. Choi

(57) ABSTRACT

For fabricating a field effect transistor on an active device area of a semiconductor substrate, a gate dielectric and a gate electrode are formed on the active device area of the semiconductor substrate. Antimony (Sb) dopant is implanted into exposed regions of the active device area of the semiconductor substrate to form at least one of drain and source extension junctions and/or drain and source contact junctions. A low temperature thermal anneal process at a temperature less than about 950° Celsius is performed for activating the antimony (Sb) dopant within the drain and source extension junctions and/or drain and source contact junctions. In one embodiment of the present invention, the drain and source contact junctions are formed and thermally annealed before the formation of the drain and source extension junctions in a disposable spacer process for further minimizing heating of the drain and source extension junctions. In another embodiment of the present invention, the drain and source extension junctions and/or the drain and source contact junctions are formed to be amorphous before the thermal anneal process. In that case, a SPE (solid phase epitaxy) activation process in performed for activating the antimony (Sb) dopant within the amorphous drain and source extension junctions and/or the amorphous drain and source contact junctions at a temperature less than about 650° Celsius.

14 Claims, 8 Drawing Sheets

FABRICATION OF FIELD EFFECT TRANSISTOR WITH SHALLOW JUNCTIONS USING LOW TEMPERATURE ACTIVATION OF ANTIMONY

TECHNICAL FIELD

The present invention relates generally to fabrication of field effect transistors having scaled-down dimensions, and more particularly, to fabrication of a field effect transistor using low temperature activation of antimony such that the depth of the junctions of the field effect transistor may be minimized.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes spacers 122 disposed on the sidewalls of the gate electrode 118 and the gate dielectric 116. When the spacers 122 are comprised of silicon nitride ($Si_3N_4$), then a spacer liner oxide 124 is deposited as a buffer layer between the spacers 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100, including the channel length of the MOSFET 100, are scaled down further, the depth of the drain and source extension junctions 104 and 106 are desired to be shallower for minimizing undesired short channel effects of the MOSFET 100, as known to one of ordinary skill in the art of integrated circuit fabrication. However, a shallower depth for the drain and source extension junctions 104 and 106 typically results in higher sheet resistance at the drain and source extension junctions 104 and 106. Such higher parasitic resistance at the drain and source of the MOSFET 100 undesirably slows down the speed performance of the MOSFET 100. Thus, a mechanism is desired for fabricating the drain and source extension junctions 104 and 106 with minimized depth but also with minimized sheet resistance.

Furthermore, as the dimensions of the MOSFET 100 are scaled down further, the thickness of the gate dielectric 116 is also further scaled down for achieving a desired threshold voltage. However, a thinner gate dielectric 116 results in undesired leakage current through the gate of the MOSFET 100 from charge carrier tunneling through such a thin gate dielectric 116. A high-K dielectric material with a dielectric constant higher than that of silicon dioxide ($SiO_2$) is used instead of silicon dioxide ($SiO_2$) for the gate dielectric 116. Such a gate dielectric 116 comprised of a high-K dielectric material is formed with higher thickness than if the gate dielectric 116 were comprised of silicon dioxide ($SiO_2$) for attaining a given threshold voltage.

Such a higher thickness of the gate dielectric 116 comprised of a high-K dielectric material minimizes undesired leakage current through the gate of the MOSFET 100 from charge carrier tunneling through the gate dielectric 116. However, high-K dielectric materials tend to be thermally unstable at relatively high temperatures greater than about 950° Celsius. Thus, low thermal anneal processes are desired for activating the dopant within the drain and source extension junctions 104 and 106 and within the drain and source contact junctions 108 and 112 for preserving integrity of the gate dielectric 116 comprised of a high-K dielectric material.

SUMMARY OF THE INVENTION

Accordingly, in a general aspect of the present invention, a field effect transistor is fabricated with antimony (Sb) dopant implantation for the drain and source extension junctions and/or the drain and source contact junctions for low temperature activation of the antimony dopant and for minimized parasitic resistance at the drain and source of the field effect transistor.

In one embodiment of the present invention, for fabricating a field effect transistor on an active device area of a semiconductor substrate, a gate dielectric and a gate electrode are formed on the active device area of the semiconductor substrate. Antimony (Sb) dopant is implanted into exposed regions of the active device area of the semiconductor substrate to form a drain extension junction and a source extension junction. A low temperature thermal anneal process at a temperature less than about 950° Celsius is performed for activating the antimony (Sb) dopant within the drain and source extension junctions.

In another embodiment of the present invention, spacers are formed at sidewalls of the gate dielectric and the gate electrode. Antimony (Sb) dopant is implanted into exposed regions of the active device area of the semiconductor substrate to form a drain contact junction and a source contact junction having a deeper depth than the drain and source extension junctions. A low temperature thermal anneal process is performed at a temperature less than about 950° Celsius for activating the antimony (Sb) dopant within the drain and source contact junctions.

The present invention may be used to particular advantage for forming both the drain and source extension junctions and the drain and source contact junctions, or for forming one of the drain and source extension junctions or the drain and source contact junctions, with such implantation of the antimony dopant and such low temperature activation. In one embodiment of the present invention, the drain and source contact junctions are formed and thermally annealed before the formation of the drain and source extension junctions in a disposable spacer process for further minimizing heating of the drain and source extension junctions.

In another embodiment of the present invention, the drain and source extension junctions and/or the drain and source contact junctions are formed to be amorphous before the thermal anneal process. In that case, a SPE (solid phase epitaxy) activation process in performed for activating the antimony (Sb) dopant within the amorphous drain and source extension junctions and/or the amorphous drain and source contact junctions at a temperature less than about 650° Celsius.

In this manner, the drain and source extension junctions and/or the drain and source contact junctions are thermally annealed with relatively low temperature. Thus, the diffusion of the dopant within the drain and source extension junctions is minimized to in turn minimize the depth of the drain and source extension junctions. In addition, use of antimony as the dopant within the drain and source extension junctions results in lower sheet resistance of the drain and source extension junctions than if phosphorous or arsenic were used. Furthermore, with use of relatively low temperature for thermally annealing the drain and source extension junctions and/or the drain and source contact junctions, the integrity of the gate dielectric comprised of a high-K dielectric material is preserved.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–24 refer to elements having similar structure and function.

DETAILED DESCRIPTION

Figure 1:
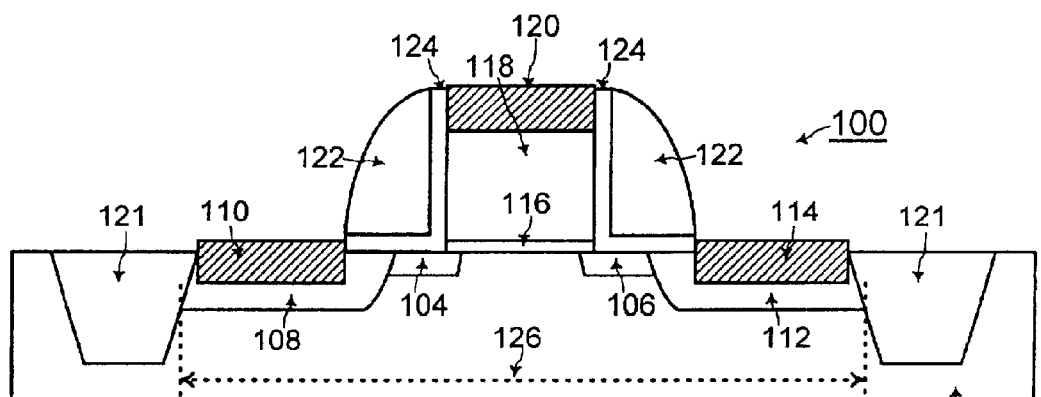
FIG. 1 shows a cross-sectional view of a conventional MOSFET (Metal Oxide Semiconductor Field Effect Transistor), according to the prior art.
Figure 2:
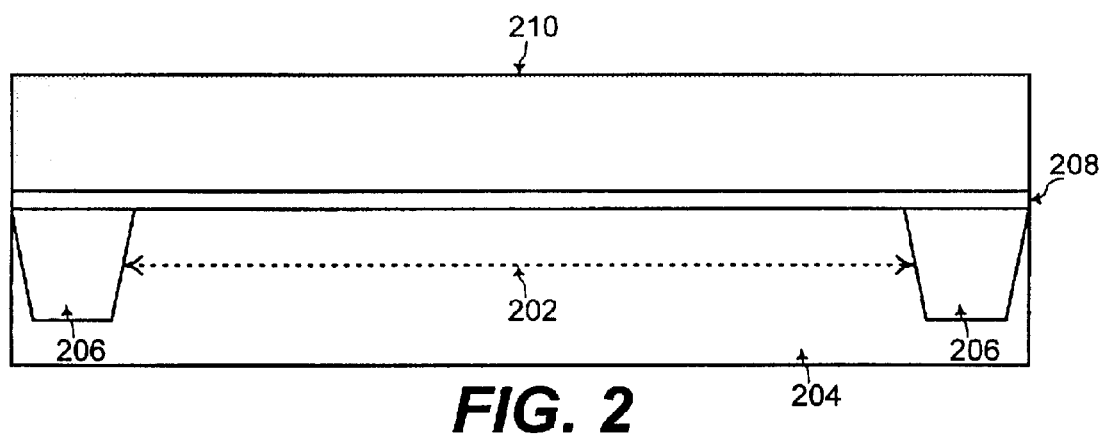
FIGS. 2–14, show cross-sectional views illustrating fabrication of a MOSFET (metal oxide semiconductor field effect transistor) with antimony (Sb) dopant implantation for the drain and source extension junctions and/or the drain and source contact junctions for low temperature activation of the antimony dopant and for minimized parasitic resistance at the drain and source of the field effect transistor, according to one embodiment of the present invention.

Referring to FIG. 2, according to an embodiment of the present invention, a C MOSFET (metal oxide semiconductor field effect transistor) is fabricated on an active device area 202 of a semiconductor substrate 204 defined by shallow trench isolation structures 206. The semiconductor substrate 204 is comprised of silicon, and the shallow trench isolation structures 206 are comprised of silicon dioxide ($SiO_2$), according to one embodiment of the present invention. Processes for fabricating the shallow trench isolation structures 206 within the semiconductor substrate 204 are known to one of ordinary skill in the art of integrated circuit fabrication.

Further referring to FIG. 2, a layer of gate dielectric material 208 is deposited on the semiconductor substrate 204, and a layer of gate electrode material 210 is deposited on the layer of gate dielectric material 208. The layer of gate dielectric material 208 is comprised of a high-K dielectric material having a dielectric constant higher than that of silicon dioxide ($SiO_2$), according to one embodiment of the present invention. The layer of gate electrode material 210 is comprised of polysilicon, according to one embodiment of the present invention. Processes for deposition of such a layer of gate dielectric material 208 and such a layer of gate electrode material 210 are known to one of ordinary skill in the art of integrated circuit fabrication.

Figure 3:
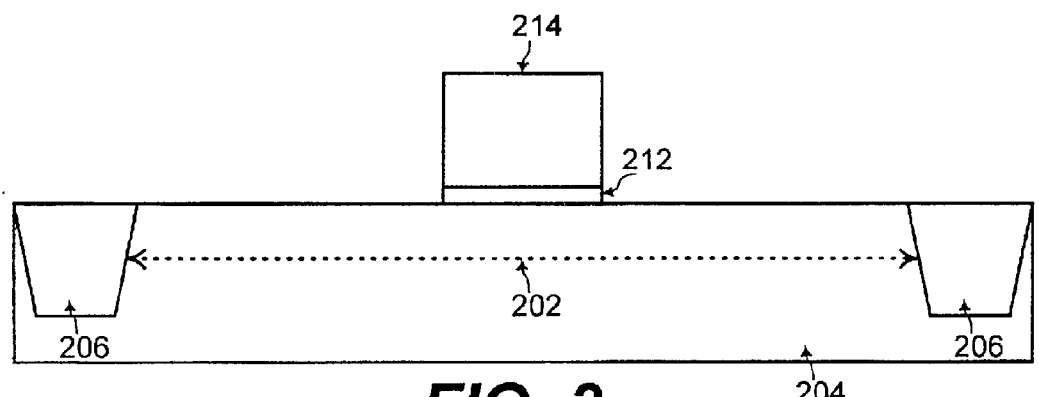

Referring to FIG. 3, the layer of gate dielectric material 208 and the layer of gate electrode material 210 are patterned to form a gate dielectric 212 comprised of the gate dielectric material 208 and a gate electrode 214 comprised of the gate electrode material 210 on the active device area 202 of the semiconductor wafer 204. Processes for patterning the layer of gate dielectric material 208 and the layer of gate electrode material 210 to form the gate dielectric 212 and the gate electrode 214 are known to one of ordinary skill in the art of integrated circuit fabrication.

Figure 4:
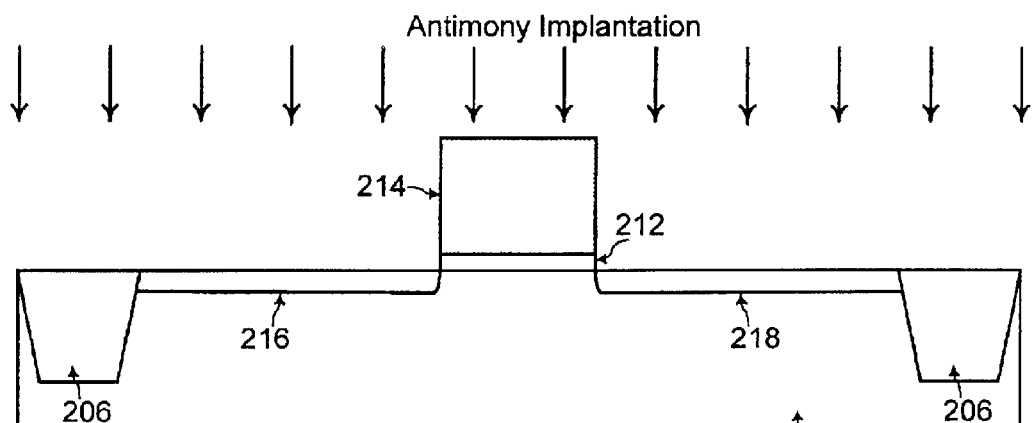

Referring to FIG. 4, after formation of the gate dielectric 212 and the gate electrode 214, antimony (Sb) dopant is implanted into exposed regions of the active device area 202 of the semiconductor wafer 204 to form a drain extension junction 216 and a source extension junction 218. In one embodiment of the present invention, the antimony dopant is implanted into the drain and source extension junctions 216 and 218 to have a relatively high concentration of from about $1\times10^{15}$ to about $1\times10^{16}$ antimony atoms/cm$^2$. In addition, the antimony dopant is implanted to form the drain and source extension junctions 216 and 218 that have a relatively shallow depth of lower than about 200 Å (angstroms). Implantation processes in general are known to one of ordinary skill in the art of integrated circuit fabrication.

Figure 5:
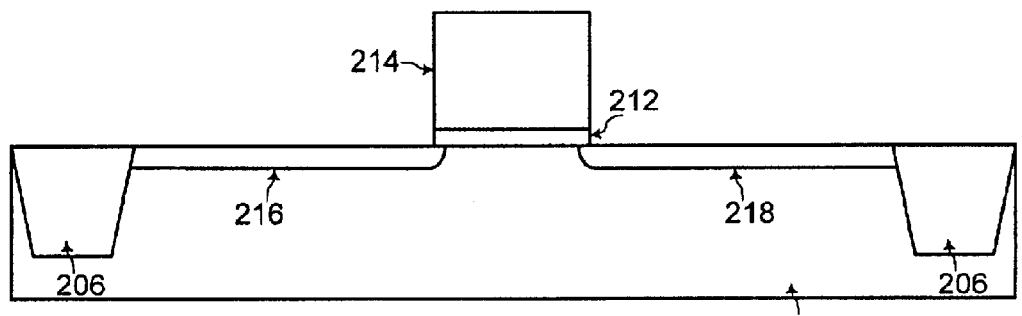

Referring to FIG. 5, a thermal anneal process is performed for activating the antimony dopant within the drain and source extension junctions 216 and 218 at a relatively low temperature of from about 500° Celsius to about 900° Celsius. Applicants performed an experiment of forming a first experimental junction with phosphorous implanted therein with a dopant concentration of $1.5\times10^{15}$ phosphorous atoms/cm$^2$, a second experimental junction with arsenic implanted therein with a dopant concentration of $1.5\times10^{15}$ arsenic atoms/cm$^2$, and a third experimental junction with antimony (Sb) implanted therein with a dopant concentration of $1.0\times10^5$ arsenic atoms/cm$^2$.

The first, second, and third experimental junctions were each formed with a relatively shallow junction depth of about 200 Å (angstroms) and were each thermally annealed at a relatively low temperature of about 600° Celsius for a time period of about 60 minutes. After such a low temperature anneal, the third experimental junction with antimony (Sb) implanted therein has significantly lower sheet resistance than the first and second experimental junctions having phosphorous or arsenic implanted therein.

Thus, with antimony (Sb) dopant implanted for forming the drain and source extension junctions 216 and 218, a relatively low temperature within the range of from about 500° Celsius to about 900° Celsius is used for activating the antimony dopant within the drain and source extension junctions 216 and 218. Furthermore, when the drain and source extension junctions 216 and 218 are formed to be amorphous, even a lower temperature within the range of from about 500° Celsius to about 650° is used for in activating the antimony dopant in a SPE (solid phase epitaxy) activation process within the drain and source extension junctions 216 and 218. When the drain and source extension junctions 216 and 218 are not formed to be amorphous, a temperature within the higher range of from about 800° Celsius to about 900° is used for activating the antimony dopant within the drain and source extension junctions 216 and 218.

Figure 6:
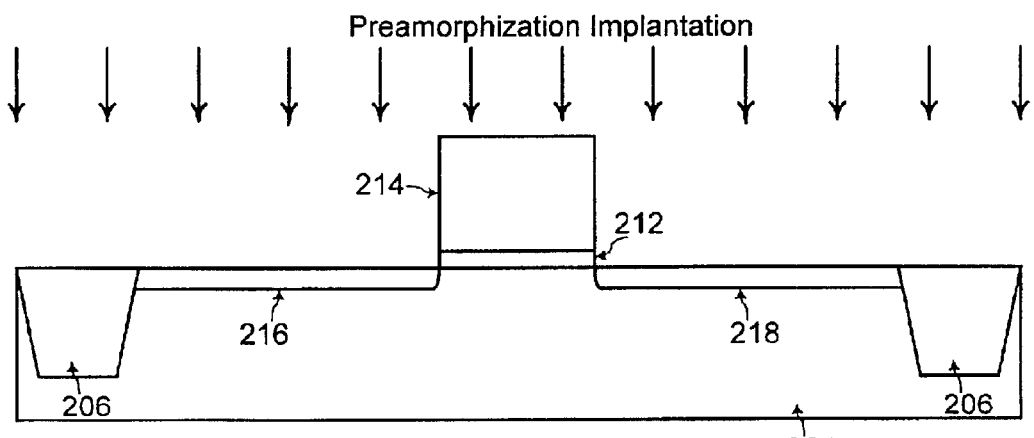

For example, the implantation energy during implantation of the antimony (Sb) dopant in FIG. 4 may be adjusted to form the drain and source extension junctions 216 and 218 to be amorphous since antimony (Sb) is a relatively heavy dopant. Referring to FIG. 6, in another embodiment of the present invention, a preamorphization species comprised of at least one of silicon (Si), germanium (Ge), or xenon (Xe) is also implanted into the drain and source extension junctions 216 and 218 for forming the drain and source extension junctions 216 and 218 to be amorphous.

In either case, the drain and source extension junctions 216 and 218 are formed to be amorphous before the thermal anneal for activating the antimony dopant within the drain and source extension junctions 216 and 218. With the drain and source extension junctions 216 and 218 formed to be amorphous, a lower temperature within the range of from about 500° Celsius to about 650° is used for activating the antimony dopant in a SPE (solid phase epitaxy) activation process within the drain and source extension junctions 216 and 218. Formation of amorphous regions within a semiconductor substrate comprised of silicon by implantation of relatively heavy species is known to one of ordinary skill in the art of integrated circuit fabrication.

Figure 7:
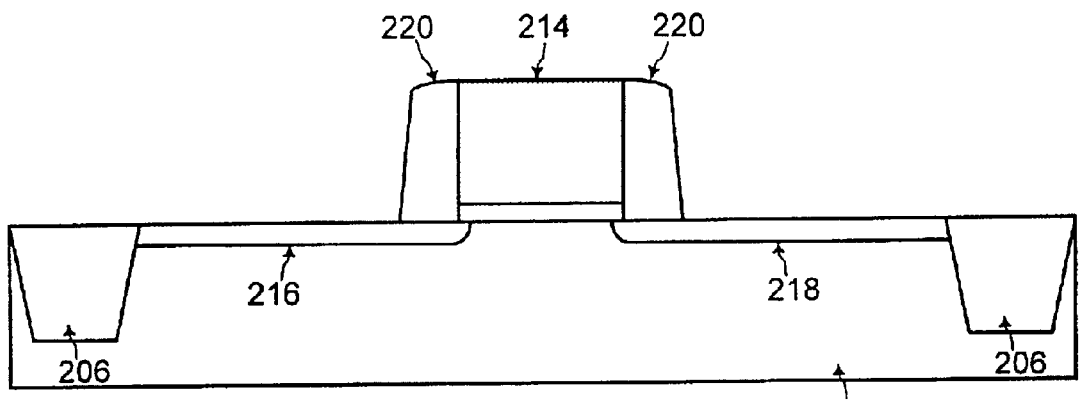

Referring to FIG. 7, after formation of the drain and source extension junctions 216 and 218, spacers 220 are formed on sidewalls of the gate electrode 214 and gate dielectric 212. The spacers 220 are comprised of a dielectric material such as silicon dioxide ($SiO_2$), according to one embodiment of the present invention. Alternatively, the spacers 220 are comprised of silicon nitride ($Si_3N_4$), and in that case a spacer liner oxide (not shown in FIG. 7 for clarity of illustration) is deposited as a buffer layer between the spacers 220 and the gate electrode 214, the gate dielectric 212, and the semiconductor substrate 204. Processes for formation of such spacers 220 are known to one of ordinary skill in the art of integrated circuit fabrication.

Figure 8:
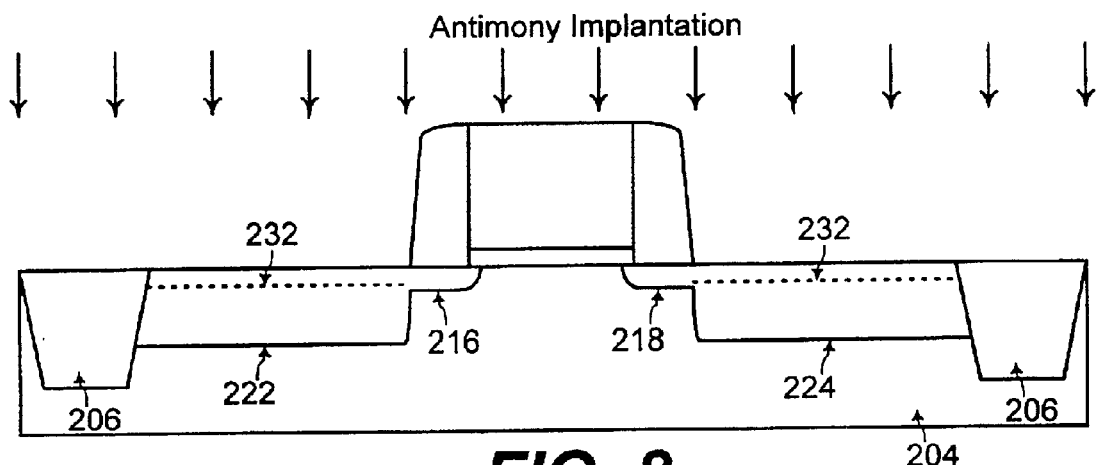

Referring to FIG. 8, after formation of the spacers 220, antimony (Sb) dopant is implanted into exposed regions of the active device area 202 of the semiconductor wafer 204 to form a drain contact junction 222 and a source contact junction 224. In one embodiment of the present invention, the antimony dopant is implanted into the drain and source contact junctions 222 and 224 to have a relatively high concentration of from about $1\times10^{15}$ to about $1\times10^{16}$ antimony atoms/$cm^2$. In addition, the antimony dopant is implanted to form the drain and source contact junctions 222 and 224 with a higher depth than that of the drain and source extension junctions 216 and 218. Implantation processes in general are known to one of ordinary skill in the art of integrated circuit fabrication.

Figure 9:
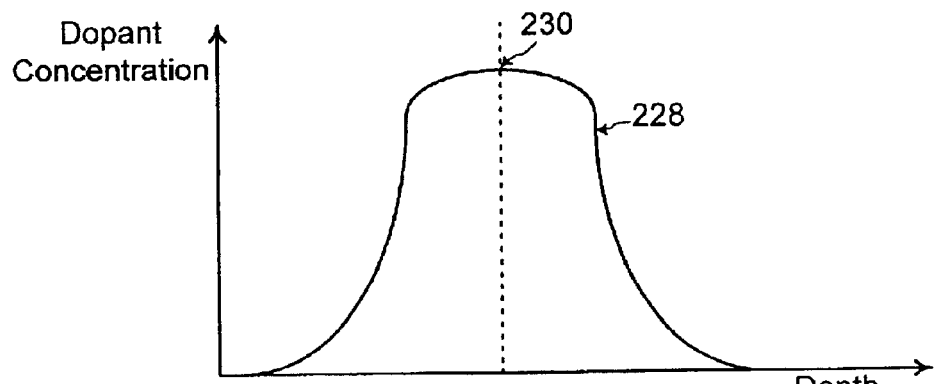

According to one embodiment of the present invention, when the drain and source contact junctions 222 and 224 have a relatively high depth of greater than about 1,000 Å (angstroms) for example, a plurality of implantation processes are performed with the antimony dopant. Referring to FIG. 9, a concentration profile 228 of a dopant with the depth into the semiconductor wafer is typically a Gaussian distribution with a peak concentration 230, as known to one of ordinary skill in the art of integrated circuit fabrication.

Figure 10:
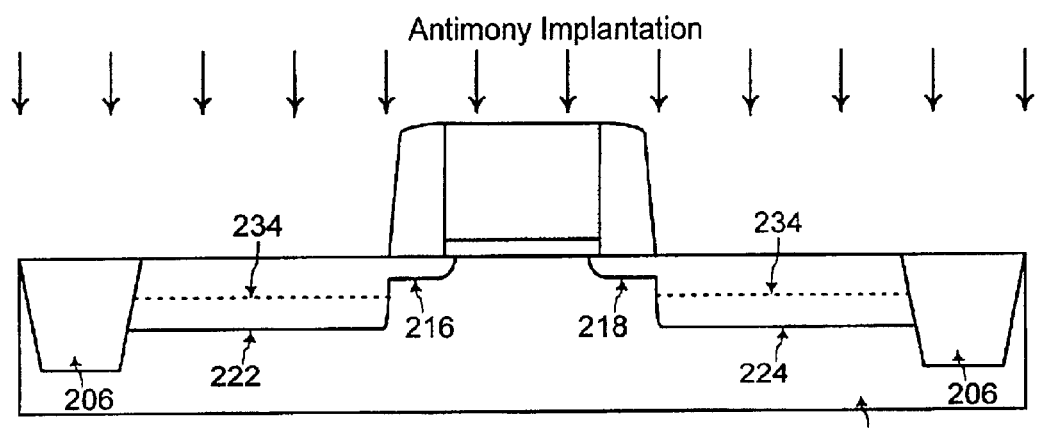
Figure 11:
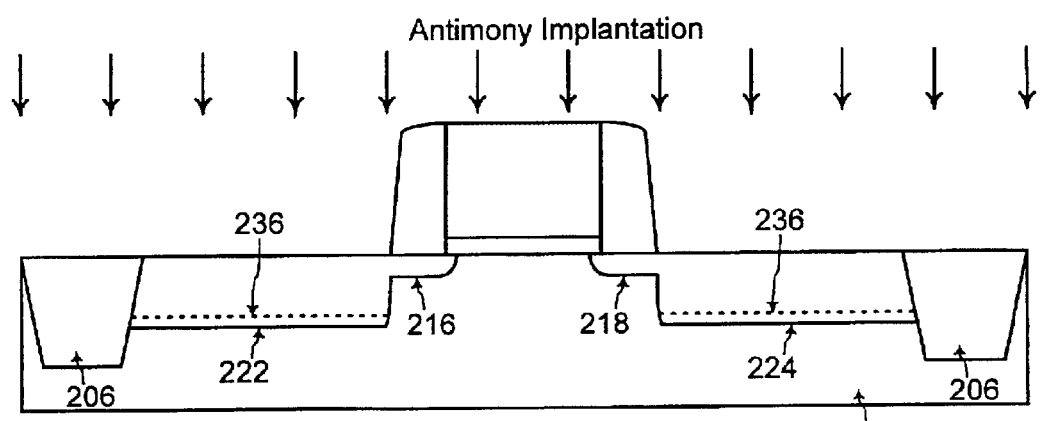

When the drain and source contact junctions 222 and 224 are formed to have a relatively high depth of greater than about 1,000 Å, a plurality of implantation processes are performed with the antimony dopant with the respective peak concentration for each implantation process being at a different depth into the drain and source contact junctions 222 and 224. Referring to FIG. 8, a first implantation process of the antimony dopant is performed with the peak concentration of the antimony dopant being at a first depth 232 (shown with the dashed line in FIG. 8) within the drain and source contact junctions 222 and 224. Referring to FIG. 10, a second implantation process of the antimony dopant is performed with the peak concentration of the antimony dopant being at a second depth 234 (shown with the dashed line in FIG. 10) within the drain and source contact junctions 222 and 224. Referring to FIG. 11, a third implantation process of the antimony dopant is performed with the peak concentration of the antimony dopant being at a third depth 236 (shown with the dashed line in FIG. 11) within the drain and source contact junctions 222 and 224.

With such multiple implantation processes of the antimony dopant with different depths of the peak concentration of the antimony dopant, the dopant concentration of the antimony dopant is more uniform throughout the depth of the drain and source contact junctions 222 and 224 even when the drain and source contact junctions 222 and 224 are formed to have a relatively high depth of greater than about 1,000 Å. In addition, when the drain and source contact junctions 222 and 224 are formed to be amorphous, with the multiple implantation processes of the antimony dopant, the drain and source contact junctions 222 and 224 are formed to be more uniformly amorphous throughout the depth of the drain and source contact junctions 222 and 224 even when the drain and source contact junctions 222 and 224 are formed to have a relatively high depth of greater than about 1,000 Å.

Figure 12:
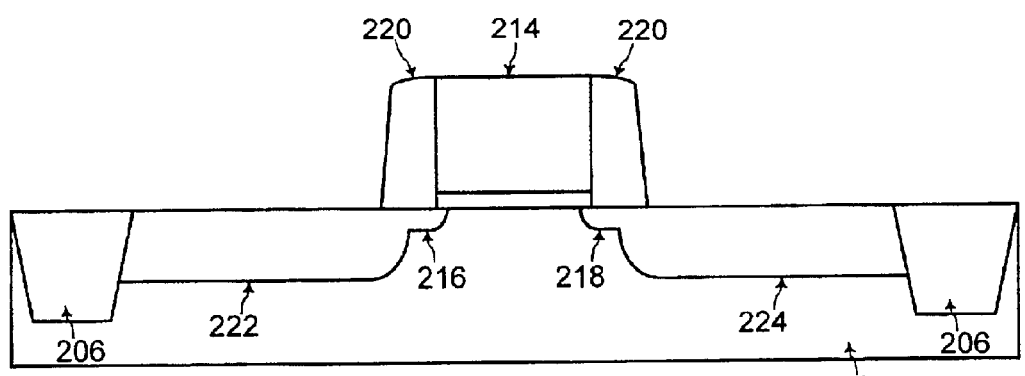

Referring to FIG. 12, a thermal anneal process is performed for activating the antimony dopant within the drain and source contact junctions 222 and 224 at a relatively low temperature of from about 500° Celsius to about 900° Celsius. With antimony (Sb) dopant implanted for forming the drain and source contact junctions 222 and 224, a relatively low temperature within the range of from about 500° Celsius to about 900° Celsius is used for activating the antimony dopant within the drain and source contact junctions 222 and 224. Furthermore, when the drain and source contact junctions 222 and 224 are formed to be amorphous, even a lower temperature within the range of from about 500° Celsius to about 650° is used for activating the antimony dopant in a SPE (solid phase epitaxy) activation process within the drain and source contact junctions 222 and 224. When the drain and source contact junctions 222 and 224 are not formed to be amorphous, a temperature within the higher range of from about 800° Celsius to about 900° is used for activating the antimony dopant within the drain and source contact junctions 222 and 224.

Figure 13:
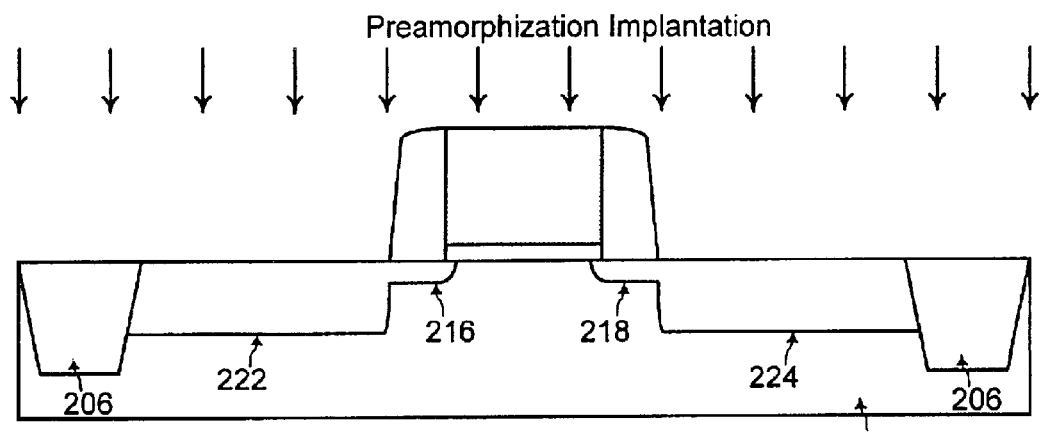

For example, the implantation energy during implantation of the antimony (Sb) dopant in FIGS. 8, 10, and 11 may be adjusted to form the drain and source contact junctions 222 and 224 to be amorphous since antimony (Sb) is a relatively heavy dopant. Referring to FIG. 13, in another embodiment of the present invention, a preamorphization species comprised of at least one of silicon (Si), germanium (Ge), or xenon (Xe) is also implanted into the drain and source contact junctions 222 and 224 for forming the drain and aid source contact junctions 222 and 224 to be amorphous. Multiple preamorphization implants with different depths for the peak concentration of the preamorphization species may be performed for a more uniform amorphous region throughout the depth of the drain and source contact junctions 222 and 224 even when the drain and source contact junctions 222 and 224 are formed to have a relatively high depth of greater than about 1,000 Å.

In either case, the drain and source contact junctions 222 and 224 are formed to be amorphous before the thermal anneal for activating the antimony dopant within the drain and source contact junctions 222 and 224. With the drain and source contact junctions 222 and 224 formed to be amorphous, a lower temperature within the range of from about 500 Å Celsius to about 650° is used for activating the antimony dopant in a SPE (solid phase epitaxy) activation process within the drain and source contact junctions 222 and 224. Formation of amorphous regions within a semiconductor substrate comprised of silicon by implantation of relatively heavy species is known to one of ordinary skill in the art of integrated circuit fabrication.

Figure 14:
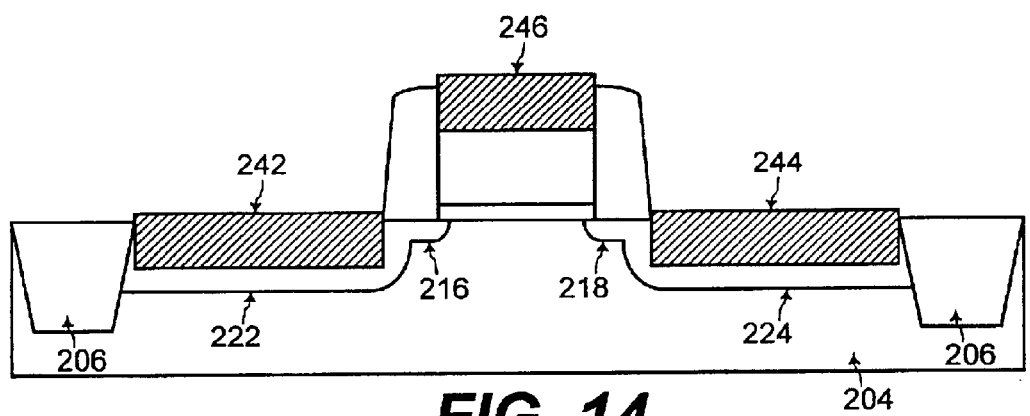

Referring to FIG. 14, after formation of the drain and source extension junctions 216 and 218 and the formation of the drain and source contact junctions 222 and 224, silicides are formed for providing low resistance contact to electrodes of the MOSFET. A drain silicide 242 is formed with the drain contact junction 222, a source silicide 244 is formed with the source contact junction 224, and a gate silicide 246 is formed with the gate electrode 214. The drain, source, and gate silicides 242, 244, and 246 are comprised of nickel silicide (NiSi) amenable for formation in a silicidation anneal process using relatively low temperatures, according to one embodiment of the present invention. Silicidation processes for formation of such drain, source, and gate silicides 242, 244, and 246 are known to one of ordinary skill in the art of integrated circuit fabrication.

In this manner, the drain and source extension junctions 216 and 218 and/or the drain and source contact junctions 222 and 224 are thermally annealed with a relatively low temperature. Thus, the diffusion of the antimony dopant within the drain and source extension junctions 216 and 218 is minimized to in turn minimize the depth of the drain and source extension junctions 216 and 218. In addition, use of antimony as the dopant within the drain and source extension junctions 216 and 218 results in lower sheet resistance of the drain and source extension junctions 216 and 218 than if phosphorous or arsenic were used for the drain and source extension junctions 216 and 218 having a shallow depth of less than about 200 Å(angstroms). Furthermore, with use of relatively low temperature for thermally annealing the drain and source extension junctions 216 and 218 and/or the drain and source contact junctions 222 and 224, the integrity of the gate dielectric 212 comprised of a high-K dielectric material is preserved.

The foregoing is by way of example only and is not intended to be limiting. For example, antimony dopant with the relatively low activation temperature may be used for formation of both the drain and source extension junctions 216 and 218 and the drain and source contact junctions 222 and 224, or for formation of either one of the drain and source extension junctions 216 and 218 or the drain and source contact junctions 222 and 224. In any case, use of antimony dopant with the relatively low activation temperature advantageously minimizes the thermal budget for fabrication of the MOSFET.

Figure 15:
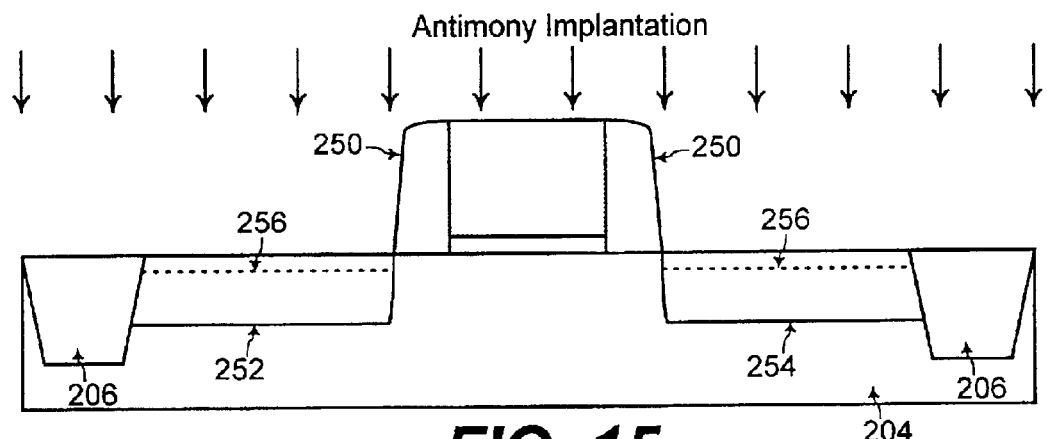
FIGS. 15–24 show cross-sectional views illustrating fabrication of a MOSFET (metal oxide semiconductor field effect transistor) with antimony (Sb) dopant implantation for the drain and source extension junctions and/or the drain and source contact junctions, where the drain and source contact junctions are formed and thermally annealed before formation of the drain and source extension junctions in a disposable spacer process for further minimizing heating of the drain and source extension junctions, according to another embodiment of the present invention.

Referring to FIG. 15, for further minimizing depth of the drain and source extension junctions of a MOSFET in another embodiment of the present invention, the drain and source contact junctions are formed before the drain and source extension junctions in a disposable spacer process. Referring to FIGS. 3 and 15, after formation of the gate dielectric 212 and the gate electrode 214 in FIG. 3 and before formation of any drain and source extension junctions, first spacers 250 are formed on the sidewalls of the gate dielectric 212 and the gate electrode 214 in FIG. 15. The first spacers 250 are similar to the spacers 220 as described herein with reference to FIG. 7. Processes for formation of such spacers 250 are known to one of ordinary skill in the art of integrated circuit fabrication.

Further referring to FIG. 15, after formation of the spacers 250 and before formation of any drain and source extension junctions, antimony (Sb) dopant is implanted into exposed regions of the active device area 202 of the semiconductor wafer 204 to form a drain contact junction 252 and a source contact junction 254. In one embodiment of the present invention, the antimony dopant is implanted into the drain and source contact junctions 252 and 254 to have a relatively high concentration of from about $1 \times 10^{15}$ to about $1-10^{16}$ antimony atoms/cm$^2$. Implantation processes in general are known to one of ordinary skill in the art of integrated circuit fabrication.

Figure 16:
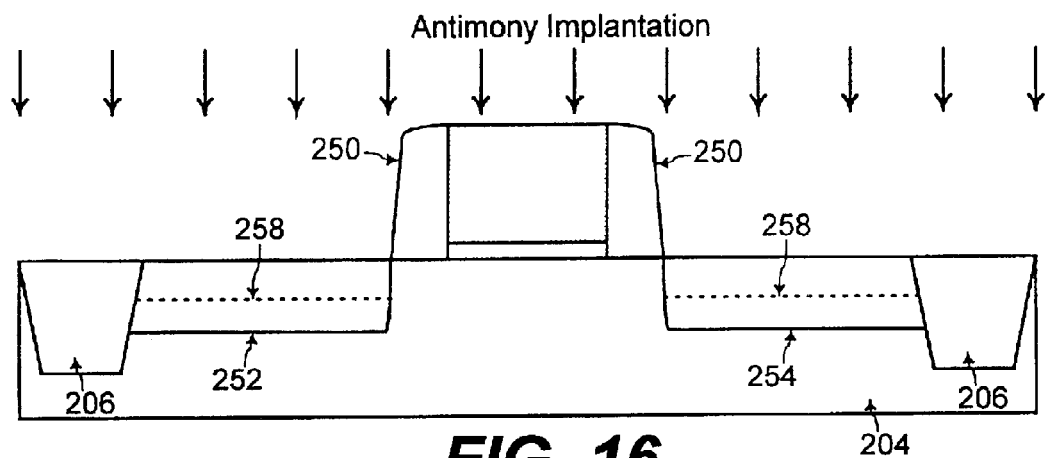
Figure 17:
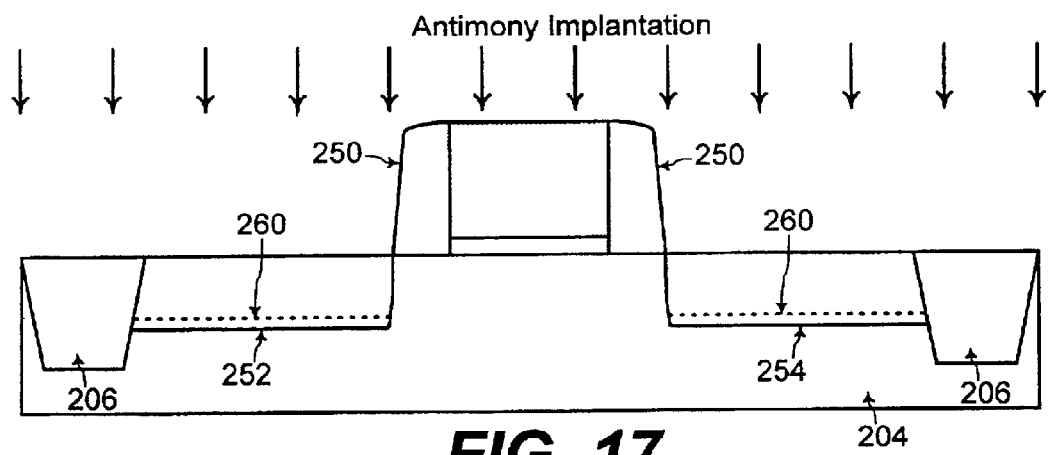

According to one embodiment of the present invention, when the drain and source contact junctions 252 and 254 have a relatively high depth of greater than about 1,000 Å (angstroms) for example, a plurality of implantation processes are performed with the respective peak concentration of the antimony dopant for each implantation process being at a different depth into the drain and source contact junctions 252 and 254. Referring to FIG. 15, a first implantation process of the antimony dopant is performed with the peak concentration of the antimony dopant being at a first depth 256 (shown with the dashed line in FIG. 15) within the drain and source contact junctions 252 and 254. Referring to FIG. 16, a second implantation process of the antimony dopant is performed with the peak concentration of the antimony dopant being at a second depth 258 (shown with the dashed line in FIG. 16) within the drain and source contact junctions 252 and 254. Referring to FIG. 17, a third implantation process of the antimony dopant is performed with the peak concentration of the antimony dopant being at a third depth 260 (shown with the dashed line in FIG. 17) within the drain and source contact junctions 252 and 254.

With such multiple implantation processes of the antimony dopant with different depths for the peak concentration of the antimony dopant, the dopant concentration of the antimony dopant is more uniform throughout the depth of the drain and source contact junctions 252 and 254 even when the drain and source contact junctions 252 and 254 are formed to have a relatively high depth of greater than about 1,000 Å. In addition, when the drain and source contact junctions 252 and 254 are formed to be amorphous, with the multiple implantation processes of the antimony dopant, the drain and source contact junctions 252 and 254 are formed to be more uniformly amorphous throughout the depth of the drain and source contact junctions 252 and 254 even when the drain and source contact junctions 252 and 254 are formed to have a relatively high depth of greater than about 1,000 Å.

Figure 18:
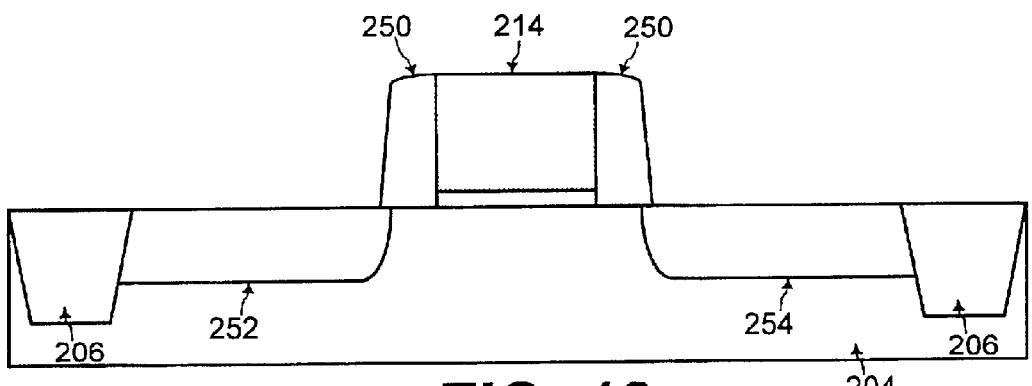

Referring to FIG. 18, a thermal anneal process is performed for activating the antimony dopant within the drain and source contact junctions 252 and 254 at a relatively low temperature of from about 500° Celsius to about 900° Celsius. With antimony (Sb) dopant implanted for forming the drain and source contact junctions 252 and 254, a relatively low temperature within the range of from about 500° Celsius to about 900° Celsius is used for activating the antimony dopant within the drain and source contact junctions 252 and 254. Furthermore, when the drain and source contact junctions 252 and 254 are formed to be amorphous, even a lower temperature within the range of from about 500° Celsius to about 650° is used for activating the antimony dopant in a SPE (solid phase epitaxy) activation process within the drain and source contact junctions 252 and 254. When the drain and source contact junctions 252 and 254 are not formed to be amorphous, a temperature within the higher range of from about 800° Celsius to about 900° is used for activating the antimony dopant within the drain and source contact junctions 252 and 254.

Figure 19:
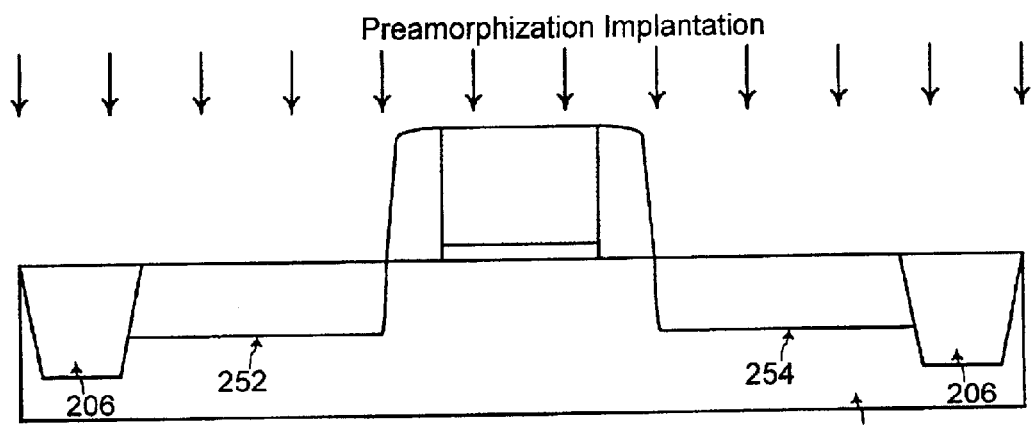

For example, the implantation energy during implantation of the antimony (Sb) dopant in FIGS. 15, 16, and 17 may be adjusted to form the drain and source contact junctions 252 and 254 to be amorphous since antimony (Sb) is a relatively heavy dopant. Referring to FIG. 19, in another embodiment of the present invention, a preamorphization species comprised of at least one of silicon (Si), germanium (Ge), or xenon (Xe) is also implanted into the drain and source contact junctions 252 and 254 for forming the drain and source contact junctions 252 and 254 to be amorphous. Multiple preamorphization implants with different depths for the peak concentration of the preamorphization species may be performed for a more uniform amorphous region throughout the depth of the drain and source contact junctions 252 and 254 even when the drain and source contact junctions 252 and 254 are formed to have a relatively high depth of greater than about 1,000 Å.

In either case, the drain and source contact junctions 252 and 254 are formed to be amorphous before the thermal anneal for activating the antimony dopant within the drain and source contact junctions 252 and 254. With the drain and source contact junctions 252 and 254 formed to be amorphous, a lower temperature within the range of from about 500 Å Celsius to about 650° is used for activating the antimony dopant in a SPE (solid phase epitaxy) activation process within the drain and source contact junctions 252 and 254. Formation of amorphous regions within a semiconductor substrate comprised of silicon by implantation of relatively heavy species is known to one of ordinary skill in the art of integrated circuit fabrication.

Figure 20:
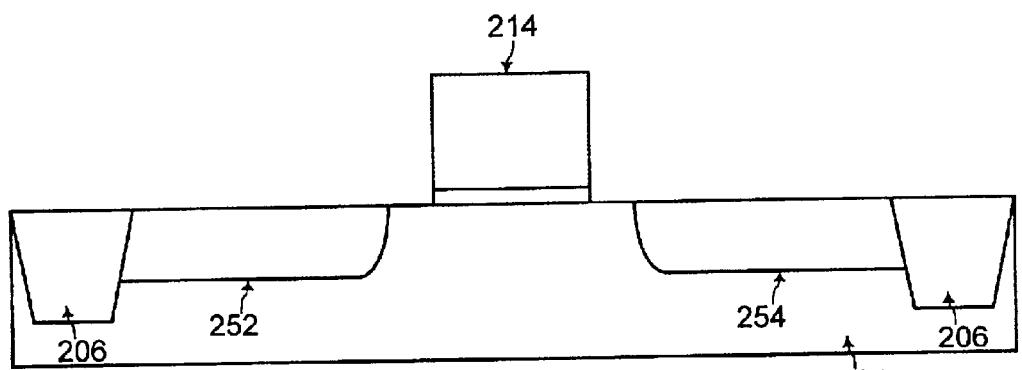

Referring to FIG. 20, after formation of the drain and source contact junctions 252 and 254, the first spacers 250 are etched away. Processes for etching away the first spacers 250, comprised of silicon dioxide ($SiO_2$) or silicon nitride ($Si_3N_4$) for example, are known to one of ordinary skill in the art of integrated circuit fabrication.

Figure 21:
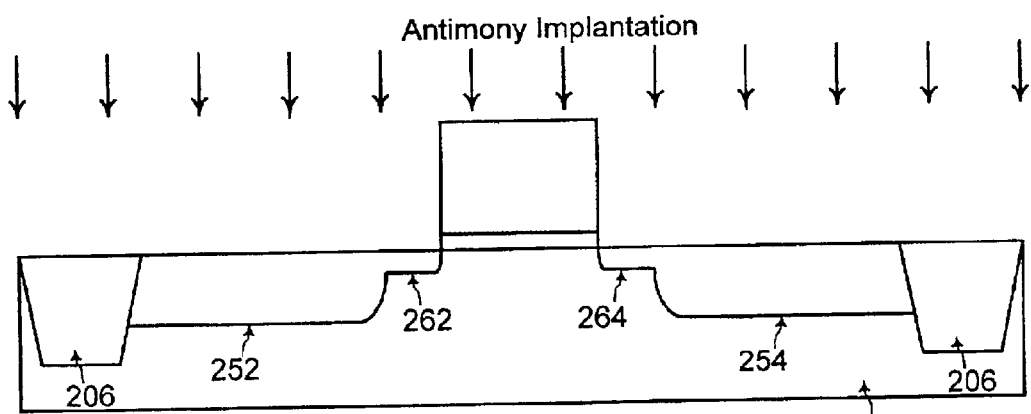

Referring to FIG. 21, after removal of the spacers 250, antimony (Sb) dopant is implanted into exposed regions of the active device area 202 of the semiconductor wafer 204 to form a drain extension junction 262 and a source extension junction 264. In one embodiment of the present invention, the antimony dopant is implanted into the drain and source extension junctions 262 and 264 to have a relatively high concentration of from about $1\times10^{15}$ to about $1\times10^{16}$ antimony atoms/cm². In addition, the antimony dopant is implanted to form the drain and source extension junctions 262 and 264 that have a relatively shallow depth of lower than about 200 Å (angstroms). Implantation processes in general are known to one of ordinary skill in the art of integrated circuit fabrication.

Figure 22:
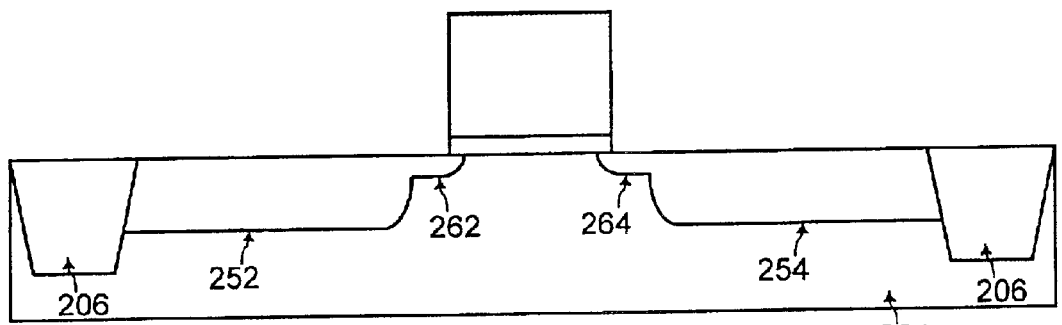

Referring to FIG. 22, a thermal anneal process is performed for activating the antimony dopant within the drain and source extension junctions 262 and 264 at a relatively low temperature of from about 500° Celsius to about 900° Celsius. With antimony (Sb) dopant implanted for forming the drain and source extension junctions 262 and 264, a relatively low temperature within the range of from about 500° Celsius to about 900° Celsius is used for activating the antimony dopant within the drain and source extension junctions 262 and 264. Furthermore, when the drain and source extension junctions 262 and 264 are formed to be amorphous, even a lower temperature within the range of from about 500° Celsius to about 650° is used for activating the antimony dopant in a SPE (solid phase epitaxy) activation process within the drain and source extension junctions 262 and 264. When the drain and source extension junctions 262 and 264 are not formed to be amorphous, a temperature within the higher range of from about 800° Celsius to about 900° is used for activating the antimony dopant within the drain and source extension junctions 262 and 264.

Figure 23:
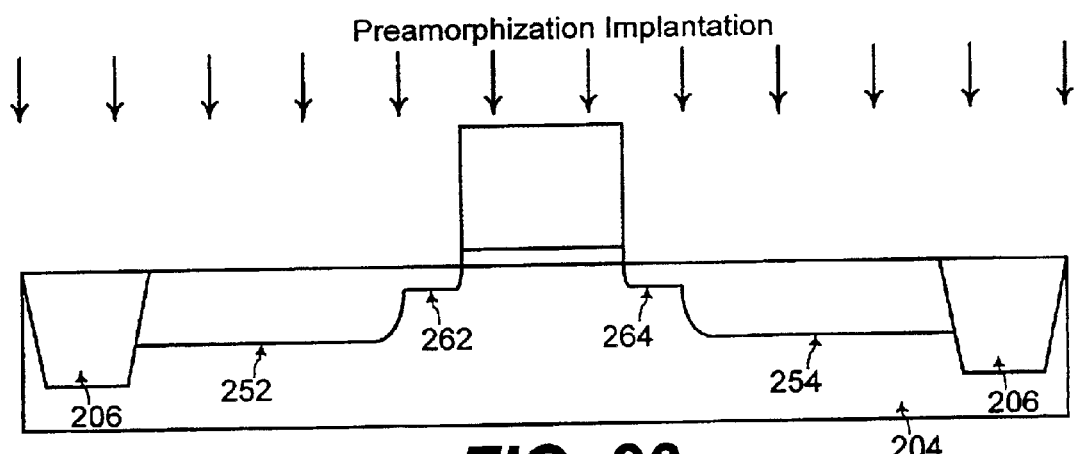

For example, the implantation energy during implantation of the antimony (Sb) dopant in FIG. 21 may be adjusted to form the drain and source extension junctions 262 and 264 to be amorphous since antimony (Sb) is a relatively heavy dopant. Referring to FIG. 23, in another embodiment of the present invention, a preamorphization species comprised of at least one of silicon (Si), germanium (Ge), or xenon (Xe) is also implanted into the drain and source extension junctions 262 and 264 for forming the drain and source extension junctions 262 and 264 to be amorphous.

In either case, the drain and source extension junctions 262 and 264 are formed to be amorphous before the thermal anneal for activating the antimony dopant within the drain and source extension junctions 262 and 264. With the drain and source extension junctions 262 and 264 formed to be amorphous, a lower temperature within the range of from about 500° Celsius to about 650° is used for activating the antimony dopant in a SPE (solid phase epitaxy) activation process within the drain and source extension junctions 262 and 264. Formation of amorphous regions within a semiconductor substrate comprised of silicon by implantation of relatively heavy species is known to one of ordinary skill in the art of integrated circuit fabrication.

Figure 24:
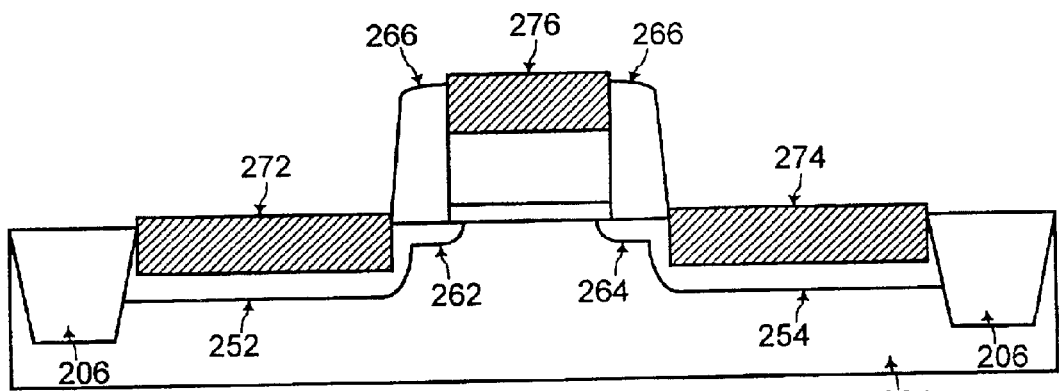

Referring to FIG. 24, after formation of the drain and source extension junctions 262 and 264, second spacers 266 are formed at sidewalls of the gate electrode 214 and gate dielectric. The second spacers 266 are similar to the spacers 220 as described herein with reference to FIG. 7. Processes for formation of such second spacers 266 are known to one of ordinary skill in the art of integrated circuit fabrication.

In addition, silicides are formed for providing low resistance contact to electrodes of the MOSFET. A drain silicide 272 is formed with the drain contact junction 252, a source silicide 274 is formed with the source contact junction 254, and a gate silicide 276 is formed with the gate electrode 214. The drain, source, and gate silicides 272, 274, and 276 are comprised of nickel silicide (NiSi) amenable for formation in a silicidation anneal process using relatively low temperatures, according to one embodiment of the present invention. Silicidation processes for formation of such drain, source, and gate silicides 272, 274, and 276 are known to one of ordinary skill in the art of integrated circuit fabrication.

In this manner, in the embodiment of FIGS. 15–24, the drain and source contact junctions 252 and 254 are formed with thermal activation of the antimony dopant before formation of the drain and source extension junctions 262 and 264. Thus, the drain and source extension junctions 262 and 264 are not heated up during thermal activation of the antimony dopant within the drain and source contact junctions 252 and 254 to further minimize diffusion of antimony dopant within the drain and source extension junctions 262 and 264 and in turn the depth of the drain and source extension junctions 262 and 264.

The foregoing is by way of example only and is not intended to be limiting. For example, the drain and source contact junctions 252 and 254 may be formed before the drain and source extension junctions 262 and 264 fabricated in any manner. In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for fabricating a field effect transistor on an active device area of a semiconductor substrate, the method including the steps of:

A. forming a gate dielectric and a gate electrode on said active device area of said semiconductor substrate;

B. implanting antimony (Sb) dopant into exposed regions of said active device area of said semiconductor substrate to form a drain extension junction and a source extension junction;

C. performing a low temperature thermal anneal process at a temperature less than about 950° Celsius for activating said antimony (Sb) dopant within said drain and source extension junctions;

D. forming spacers at sidewalls of said gate dielectric and said gate electrode;

E. implanting antimony (Sb) dopant into exposed regions of said active device area of said semiconductor substrate to form a drain contact junction and a source contact junction having a deeper depth than said drain and source extension junctions;

F. performing a low temperature thermal anneal process at a temperature less than about 950° Celsius for activating said antimony (Sb) dopant within said drain and source contact junctions; and wherein said steps D, E, and F are performed after said step A and before said steps B and C such that said drain and source contact junctions are formed before said drain and source extension junctions in a disposable spacer process with an additional step of:

G. removing said spacers from said sidewalls of said gate dielectric and gate electrode after said steps E and F and before said steps B and C.

2. The method of claim 1, further including the steps of:

forming said drain and source extension junctions to be amorphous after said step B; and performing a SPE (solid phase epitaxy) activation process in said step C for activating said antimony (Sb) dopant within said amorphous drain and source extension junctions at a temperature less than about 650° Celsius.

3. The method of claim 2, wherein said drain and source extension junctions are formed to be amorphous by implantation of said antimony (Sb) dopant into said drain and source extension junctions.

4. The method of claim 2, wherein said drain and source extension junctions are formed to be amorphous by additional implantation of a preamorphization species that is different from the antimony (Sb) dopant.

5. The method of claim 4, wherein said preamorphization species is comprised of one of germanium, silicon, or xenon.

6. The method of claim 1, wherein said step E includes the step of:

performing a plurality of implantations of said antimony (Sb) dopant with different peak concentration depths within said drain and source contact junctions.

7. The method of claim 1, further including the steps of:

forming said drain and source contact junctions to be amorphous after said step E; and performing a SPE (solid phase epitaxy) activation process in said step F for activating said antimony (Sb) dopant within said amorphous drain and source contact junctions at a temperature less than about 650° Celsius.

8. The method of claim 7, wherein said drain and source contact junctions are formed to be amorphous by implantation of said antimony (Sb) dopant into said drain and source contact junctions.

9. The method of claim 7, wherein said drain and source contact junctions are formed to be amorphous by additional implantation of a preamorphization species that is different from the antimony (Sb) dopant.

10. The method of claim 9, wherein said preamorphization species is comprised of one of germanium, silicon, or xenon.

11. The method of claim 1, wherein said antimony dopant is implanted into said drain and source contact junctions in said step E with a concentration of from about $1\times10^{15}$ to about $1\times10^{16}$ antimony atoms/cm$^2$.

12. The method of claim 1, further including the step of:

forming a drain silicide with said drain contact junction and forming a source silicide with said source contact junction.

13. The method of claim 1, wherein said gate dielectric is comprised of a high-K dielectric material having a dielectric constant higher than silicon dioxide ($SiO_2$).

14. The method of claim 1, wherein said antimony dopant is implanted into said source extension junctions in said step B with a concentration of form about $1\times10^{15}$ to about $1\times10^{16}$ antimony atoms/cm$^2$.

* * * * *